US011353512B2

(12) United States Patent
Oshida et al.

(10) Patent No.: US 11,353,512 B2
(45) Date of Patent: Jun. 7, 2022

(54) LOW PASS FILTER AND FILTER DIAGNOSTICS

(71) Applicant: TEXAS INSTRUMENTS INCORPORATED, Dallas, TX (US)

(72) Inventors: Takao Oshida, Plano, TX (US); Bryan Andrew Mueller, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/071,195

(22) Filed: Oct. 15, 2020

(65) Prior Publication Data

US 2021/0025943 A1    Jan. 28, 2021

Related U.S. Application Data

(62) Division of application No. 16/008,965, filed on Jun. 14, 2018, now Pat. No. 10,838,009.

(51) Int. Cl.
*H03H 17/04*    (2006.01)
*G01R 31/36*    (2020.01)
*H03H 17/06*    (2006.01)

(52) U.S. Cl.
CPC ......... *G01R 31/3648* (2013.01); *H03H 17/04* (2013.01); *H03H 17/06* (2013.01)

(58) Field of Classification Search
CPC ..... G01R 31/3648; H03H 17/06; H03H 17/04
See application file for complete search history.

(56) References Cited

U.S. PATENT DOCUMENTS

| | | | |
|---|---|---|---|
| 6,118,331 A | 9/2000 | Yunus et al. | |
| 2008/0284444 A1* | 11/2008 | Li | G01R 31/389 324/430 |
| 2012/0310562 A1* | 12/2012 | van Lammeren | G01R 31/382 702/63 |
| 2015/0381198 A1* | 12/2015 | Lasseuguette | H03M 3/496 341/143 |
| 2017/0146614 A1* | 5/2017 | Hakenes | G01R 33/0029 |
| 2018/0054186 A1 | 2/2018 | Chen et al. | |
| 2019/0366849 A1* | 12/2019 | Pennisi | B60L 3/0046 |

* cited by examiner

*Primary Examiner* — Kenneth T Lam
(74) *Attorney, Agent, or Firm* — Mark A. Valetti; Charles A. Brill; Frank D. Cimino

(57) ABSTRACT

As one example, a filter apparatus includes an input to receive an electrical input signal. The filter apparatus includes a forward path connected between the input and an output of the filter apparatus. A feedback path is connected to provide feedback to the forward path based on an output signal at the output of the filter apparatus. A filter bypass is configured to provide the input signal directly to the output and to the feedback path for an activation phase of the filter apparatus. Diagnostics may also be performed.

18 Claims, 7 Drawing Sheets

LOW PASS FILTER AND FILTER DIAGNOSTICS

CROSS-REFERENCE TO RELATED APPLICATIONS

This application claims priority to U.S. patent application Ser. No. 16/008,965, filed Jun. 14, 2018. The entire application of Ser. No. 16/008,965 is hereby fully incorporated herein by reference.

BACKGROUND

A low-pass filter (LPF) is a filter that passes signals with a frequency lower than a certain cutoff frequency and attenuates signals with frequencies higher than the cutoff frequency. The exact frequency response of the filter depends on the filter design.

In some applications, testing circuitry may be utilized (e.g., as part of a power-up sequence) to measure and diagnose faults in one or more system components, including filters. This may be implemented for safety and/or to ensure compliance with one or more standards.

SUMMARY

As one example, a filter apparatus includes an input to receive an electrical input signal. The filter apparatus includes a forward path connected between the input and an output of the filter apparatus. A feedback path is connected to provide feedback to the forward path based on an output signal at the output of the filter apparatus. A filter bypass is configured to provide the input signal directly to the output and to the feedback path for an activation phase of the filter apparatus.

Another example provides a method that includes receiving an input signal as a filter input and filtering the input signal according to a filter transfer function to provide a filtered output signal at an output. The filtering is determined based on feedback that is derived from filtered output signal. The method also includes sending the input signal directly as the output signal to bypass the filtering of the input signal during an initial activation period. The method also includes removing the bypass to enable the filtering of the input signal after the initial activation period.

As yet another example, a diagnostic system includes a target filter configured to filter an input signal and provide a filtered output signal according to a transfer function, the target filter including memory to storing filter data. A diagnostic filter includes a first input to receive the input signal and a second input coupled to receive the filter data from the memory of the target filter. The diagnostic filter includes memory to store filter data and configured to filter the input signal and provide the filtered output signal according to the transfer function. A switch device is configured to selectively load one of the output signal of the diagnostic filter or the filter data of the target filter into the memory of the diagnostic filter depending on an operating phase of the system.

Another example provides a method that includes receiving an input signal at an input of a target filter, the target filter including filter memory to store filter data. The method also includes filtering the input signal by the target filter according to a filter transfer function and the filter data, to provide a target filtered output signal. The method also includes receiving the input signal at an input of a diagnostic filter. The diagnostic filter is also connected to load the filter data from memory of the target filter during an initialization phase. The method also includes filtering the input signal by the diagnostic filter according to the filter transfer function to provide a diagnostic filtered output signal at an output thereof. The filtering by the diagnostic filter is based on the filter data loaded into memory of the diagnostic filter from the memory of the target filter. The method also includes comparing the target filtered output signal and the diagnostic filtered output signal to detect a defect in the target digital filter.

DETAILED DESCRIPTION

This disclosure relates generally to a low pass filter and, more particularly, to low pass filtering circuitry and methods that can be implemented improved (e.g., approximately zero) settling time compared to existing filtering approaches. This disclosure also provides improved diagnostic systems and methods that can be utilized to test one or more filters with improved settling time compared to existing diagnostic methods.

As an example, a digital low pass filter is configured to filter an input signal according to a transfer function and to provide a filtered output signal. The filter mitigates settling time from activation of the filter by providing the input signal directly to the output (e.g., by bypassing the filter transfer function) and to associated filter feedback path during an initialization phase (e.g., a first cycle). After the initialization phase, the filter can be configured to apply its transfer function to perform normal filter operation. For example, the filter includes bypass circuitry that selectively either provides the filter output by coupling the input with the output in response to an initialization pulse signal (e.g., a pulse signal generated responsive to filter selection/activation). After the initialization pulse signal, the bypass circuitry provides the normal filtered output according to its low pass filter transfer function.

As another example, a diagnostic system is configured to detect a defect in one of a plurality of filters (e.g., a bank of digital filters), such as low pass filters or another type of filter (e.g., high-pass, bandpass or notch filters). Each of such filters receives a respective input signal to filter and provides a corresponding filtered output signal. Each filter also includes a filter memory (e.g., in a feedback path) that stores filter data corresponding to previous filter information. For example, the filters may be various types of digital filters, including infinite impulse response (IIR) filters or finite impulse response (FIR) filters. A diagnostic filter is configured to receive the input signal that is supplied to a given one of the filters to perform a diagnostic function for the given filter. The output of the given filter may be compared to the output of the diagnostic filter to detect a defect in the filter operation, such as part of a diagnostic mode. To mitigate settling time of the diagnostic filter, the information in the memory of the given filter may be loaded into memory of the diagnostic filter. In this way, diagnostics of each filter may be performed sequentially in less time than existing approaches.

Figure 1:
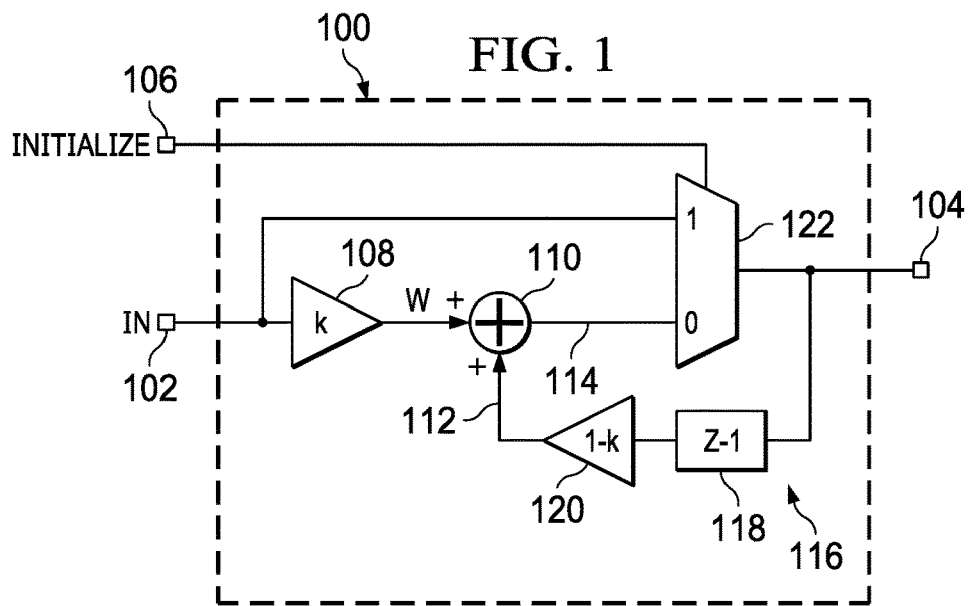
FIG. 1 illustrates an example of a filter.

FIG. 1 depicts an example of a low pass filter 100 that is configured to filter an input signal received at an input 102 and provide a corresponding filtered output signal at output 104. The filter can be implemented as a digital low pass filter operating to filter the input signal (e.g., a multi-bit digital input signal) according to a transfer function to pass frequency components below a prescribed a cutoff frequency value. As disclosed herein, the filter 100 is configured to settle the direct current (DC) portion of the input signal at 102 during an activation or initialization phase of the filter. For example, the filter 100 can receive an initialization signal at a control input 106 to place the filter 100 into an initialization phase. For example, the initialization phase can operate for one or more sample periods. In one example, the initialization phase can operate for a single cycle, corresponding to a sample period according to the sample rate used to provide the signal at the input at 102. (e.g., a multi-bit digital input signal)

The filter 100 includes a forward path connected between the input 102 and the output 104 and a feedback path connected between the output and the forward path. For the example filter 100, the forward path includes a gain stage 108 and a combiner 110. The input gain stage is configured to apply a gain factor (k) to the input signal to provide a corresponding intermediate signal W that is provided to an input of the combiner 110. For example, the input gain can be configured according to 1/(total gain), which for the example first order IIR filter is k, e.g., (1−(1−k))=k. Another input of the combiner receives a feedback signal 112 from the feedback path. The combiner thus combines the intermediate filtered signal W with the feedback signal at 112 to provide a corresponding filtered output at 114. During normal operation, after the initialization phase, the output 114 of the combiner 110 is connected directly to the output 104 of the filter. The feedback signal is generated based on the output signal at 104. In an example, the feedback path is connected between the output 104 and another input to the combiner 110. For example, the feedback path 116 includes a delay element 118 and a gain stage 120. The delay element 118 is configured to impose a predetermined delay to the output signal. The gain stage 120 is configured to apply a gain factor of (1−k) to the delayed output signal and provide the feedback to the combiner 110.

The filter 100 also includes a bypass device, such as a multiplexer 122 or other switch device, connected between the filter output 104 and the output of the forward path (combiner output 114). Another input of the multiplexer 122 is connected to 102 to receive the input signal. The multiplexer 122 is configured to send the input signal received at 102 directly to the output 104 and to the feedback path 116 for the initialization phase in response to the initialization signal at 106. Thus, the transfer function of the filter is modified such that the DC part of the input is settled during the initialization phase. By implementing the filter 100 in this manner, sending the input to the output during the first cycle and resuming normal operation thereafter, the filter can achieve low or zero settling time.

By way of example, let the output of the filter be Y and the input be X and assume that the initialization phase is a single sample period. The filter 100 may be described by the following difference equations:

$Y(n)=X(n)$, where $n=0$ $Y(n)-(1-k)Y(n-1)=kX(n)$ where $n>0$

It can be assumed that the input includes a DC component and a noise component:

$X(n)=X_{dc}+X_{noise}(n)$

Thus for n=0, the filter output becomes:

$Y(0)=X(0)=X_{dc}+X_{noise}(0)$

Then for n=1, the output changes according to its regular transfer function:

$$Y(1) = kX(1) + (1-k)Y(0)$$
$$= kX_{dc} + kX_{noise}(1) + (1-k)X_{dc} + (1-k)X_{noise}(0)$$
$$= X_{dc} + kX_{noise}(1) + (1-k)X_{noise}(0)$$

And at n=2, the output Y(2) may be represented as:

$$Y(2) = kX(2) + (1-k)Y(1)$$
$$= X_{dc} + kX_{noise}(2) + k(1-k)X_{noise}(1) + (1-k)^2 X_{noise}(0)$$

And for n=m, where m is an arbitrary time, the output Y(m) becomes:

$$Y(m)=X_{dc}+kX_{noise}(m)+k(1-k)X_{noise}(m-1)+\ldots$$
$$(1-k)^{m-1}X_{noise}(1)(1-k)^m X_{noise} \qquad (0)$$

Additionally, the contribution of noise at sample m is $(1-k)^m$ as compared to an existing filter where the noise contribution is $k(1-k)^m$. Thus, the filter 100 exhibits less contribution due to noise as compared to the existing design. In the example of using the filter to filter voltage measurements of DC battery cells, the noise $X_{noise}$ is usually very small. For the multi-bit digital output, the $(1-k)^m X_{noise}(0)$ is smaller than one least significant bit (LSB) of the output, which is expected in practice, the performance of noise reduction is commensurate with traditional filter designs. Additionally, since Xdc is not be attenuated in any sample from the beginning, a zero settling time is attainable using the example filter 100.

Figure 2:
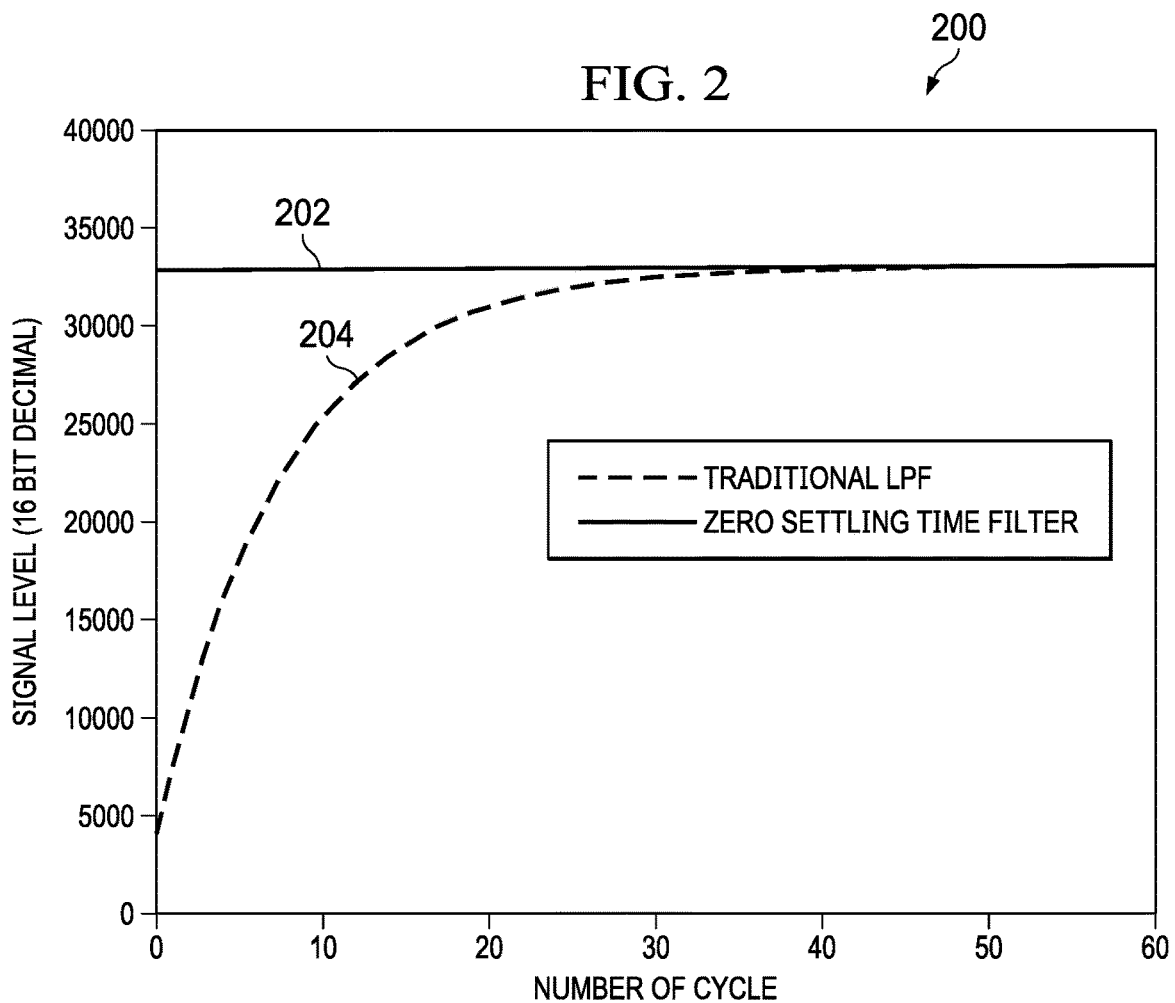
FIG. 2 is a graph illustrating performance of an example filter relative to an existing filter.

FIG. 2 is a graph 200 depicting an example of a settling time of the filter 100 of FIG. 1 compared to an existing digital low pass filter. The graph demonstrates the signal level (e.g., a multi-bit output) as a function of the number of cycles (e.g., sample periods). The graph 200 includes a plot 202 for the signal level at the output of the filter 100 and another plot 204 of the signal output of an existing low pass filter device as described above. As demonstrated in FIG. 2, the existing low pass filter is expected to settle within 0.99% of the input in about 35 cycles. In contrast, the low pass filter 100 of FIG. 1 is able to settle and remain at the desired signal level with little or no settling time. The fast settling is achieved because the DC component of the input signal 102 is settled within the first cycle by operating the bypass in response to the initialization signal. Additionally, for the example first order IIR filter 100, the gain (e.g., 1/(total gain)) has been moved to the input.

Figure 3:
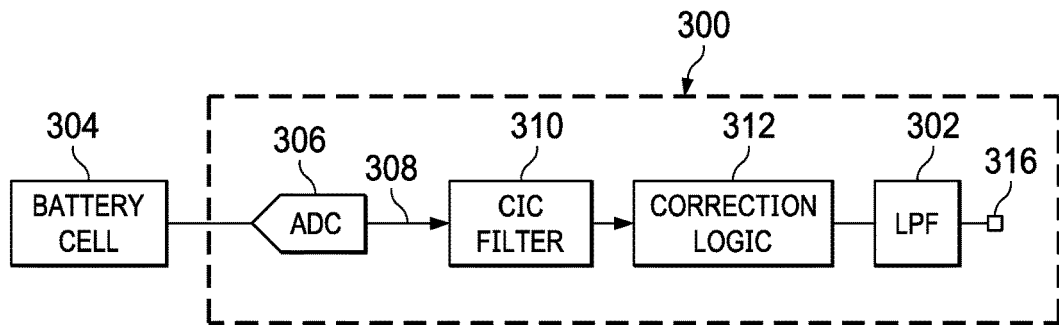
FIG. 3 illustrates an example of battery measurement system.

FIG. 3 depicts an example of a measurement system 300 implementing a low pass filter 302, such as corresponding to the filter 100 of FIG. 1. In this example, the system 300 is a battery measurement system that is configured to measure the voltage of a battery cell 304. The voltage of the battery cell 304 is provided as an analog input voltage to an analog-to-digital converter (ADC) 306. The ADC 306 is configured to sample the battery voltage at a corresponding sample rate, which may be fixed or user programmable. The ADC 306 thus converts the analog voltage from the battery cell 304 to a corresponding digital value at 308, which may be a single bit (or multi-bit) value. In some examples, the ADC 306 can be an oversampling ADC that provides a one bit output at 1 MHz frequency. The digital value is provided at the corresponding sample rate to digital signal processing components for processing the digital battery value and providing the processed digital value as a corresponding multi-bit value to the low pass filter 302.

For example, the digital signal processing can include a cascaded integrator-comb (CIC) filter 310. The CIC filter 310 can include one or more integrator and comb filter pairs that are configured to process the digital output value 308 from the ADC 306. As an example, the CIC filter 310 performs low pass filtering and decimation on the ADC signal and provides a corresponding multi-bit (e.g., 25 bit) output at a lower sample rate than the digital input at 308 from the ADC. The corresponding decimated output thus is provided as a multi-bit signal to an input of correction logic 312. The correction logic 312 can be configured to implement temperature, correction and compensation on the decimated data from the CIC filter and thereby provide a temperature compensated filter digital value to the low pass filter 302. The low pass filter 302 filters the corrected digital signal to provide a corresponding output signal at 316 representing the DC voltage of the battery cell 304.

As mentioned with respect to the example of FIG. 1, during the initialization phase (e.g., one sample cycle at power up of the measurement system 300), the input signal from correction logic is passed directly to the output 316 and after the initialization phase, the low pass filter 302 operates according to its designed transfer function and performs low pass filtering on the corrected signal to thereby provide the voltage measurement value at 316. The low pass filter 302 thus can operate on the corrected output to provide the corresponding measurement voltage output at 316. While the example of FIG. 3 demonstrates a measurement system for a single battery cell, the system may be applied to any number of cells (see, e.g., FIG. 9).

Figure 4:
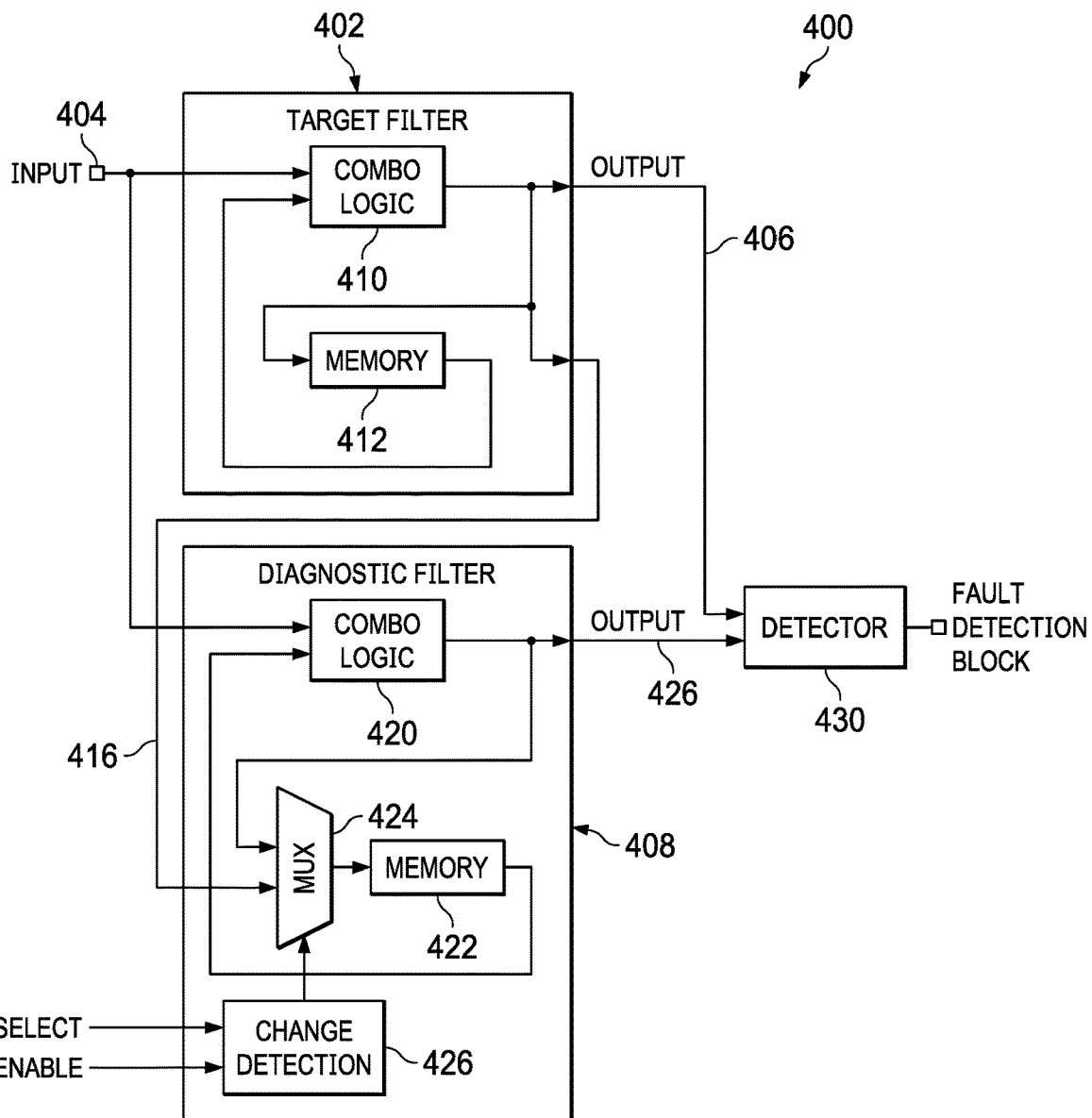
FIG. 4 illustrates an example of a filter diagnostic system.

FIG. 4 depicts an example of a diagnostic system 400 that can be utilized to detect a fault in a target filter 402. The target filter 402 is configured to operate according to a transfer function and perform filtering of an input signal received at an input 404. The target filter 402 performs its filtering according to its designed transfer function to provide a corresponding filtered output signal at an output 406. The system 400 also includes a diagnostic filter 408 that is configured to implement the same transfer function as the target filter 402. For example, the diagnostic filter 402 can be another instance of the target filter 402 implemented on an integrated circuit (IC) chip (e.g., fabricated on a common substrate).

As one example, the target filter 402 can be a low pass filter, such as low pass filter 100 disclosed with respect to FIG. 1. Thus, the diagnostic filter 408 likewise can be a low pass filter corresponding to the filter 100 of FIG. 1. One or more other types of filters (e.g., high-pass, bandpass or notch filters) may be used in other examples. In one example, each of the target filter 402 and diagnostic filter 408 can be implemented as digital filter structure, such as including an IIR filter or a FIR filter. Each of the filters includes one or more memory units to store past output filter data and/or input filter data. The configuration of the filter memory will vary depending on the type of filter (e.g., IIR or FIR) and the order of filter being implemented.

By way of example, the target filter 402 includes a forward path that includes combinational logic 410 that is connected between the input 404 and output 406. The filter 402 also includes one or more memory 412 that is connected to receive the output 406 at its input. The memory 412 provides a corresponding output as feedback to another input of the combinational logic 410. The feedback memory 412 and combinational logic 410 thus cooperate to define the filter's transfer function. In the diagnostic system, the output of the memory 412 is also supplied to the diagnostic filter 408. As mentioned, the diagnostic filter 408 is configured similarly to the filter 402. Thus, it includes combinational logic 420 and one or more memory 422. Additionally, the diagnostic filter 408 includes a switch device (demonstrated as multiplexer 424) between an output 426 of the combinational logic and the input to the memory 422.

The switch device (multiplexer) 424 is configured to selectively operate the diagnostic filter in an initialization mode or a normal mode. For example, in initialization mode, the switch device 424 is activated to transfer (e.g., write) information from memory of the target filter 402 to memory of the diagnostic filter 408. For the example filter 408 in FIG. 4, for initialization, the output 406 of the target filter is coupled with the input of memory 422. The number and arrangement of connections created by the switch device from the target filter to the diagnostic filter during initialization mode will vary according to the number of memory units of the target filter, which further depends on the type and order of filter being implemented. After the initialization of the diagnostic filter 408 is completed (e.g., memory 422 of diagnostic filter is loaded based on current data from the target filter), the switch device 424 is activated to configure the diagnostic filter for normal filter operation. For the example filter 408 in FIG. 4, for normal operation, the output 426 of the diagnostic filter is coupled with the input of memory 422.

The multiplexer 424 receives as inputs the memory output 416 from the target filter 402 and the output 426 of the combinational logic 420. The multiplexer 424 receives a control input from a change detection block 426. The change detection block 426 can be selectively activated and enabled to operate the diagnostic filter 408 in a mode to emulate the target filter 402 and perform a corresponding filter function on the same input at 404. In order to mitigate settling time associated with activating the diagnostic filter, such as when used to test the target filter 402, the change detection 426 is configured to control multiplexer 422 and write the output from memory 412 into memory 422 of the diagnostic filter 408, such as during a first part of the activation (e.g., in response select and enable inputs). After the filter data from memory 412 is loaded into memory 422 via multiplexer 424, the change detection block 426 can control the multiplexer 424 to pass the output of combination logic 420 to the memory 422 in the feedback path of filter 408. Memory 422 in turn provides corresponding feedback to the feedback input of the combinational logic block 420. Thus in this manner, each of the filters operate on the same input at 404 and because the memories contain the same data and the filters are operating according to the same transfer function, assuming expected operating conditions, each of the output signals at 406 and 426 should be the same. In this way, the diagnostic filter 408 can operate in the same state as the target filter 402, such that the corresponding filter function and filter outputs at 426 and 406 should be the same in the absence of a fault.

The filter outputs 406 and 426 are provided as inputs to a detector 430. The detector 430 is configured to compare the outputs at 406 and 426 to determine whether a fault condition exists. The detector output, for example can be connected to a fault detection block of associated circuitry. Thus the detector 430 can detect fault conditions by detecting differences between the outputs (e.g., multi-bit outputs).

Figure 5:
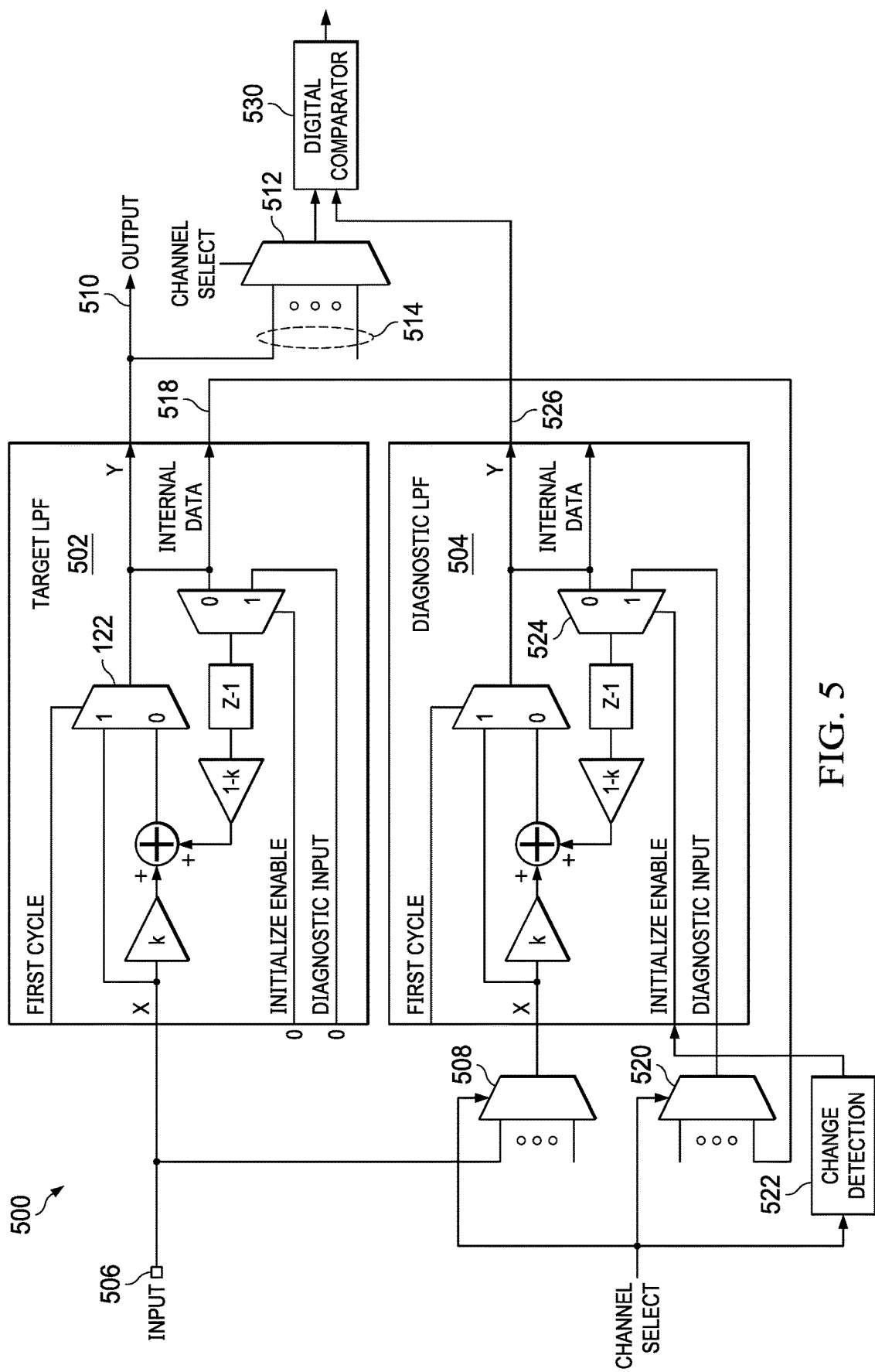
FIG. 5 illustrates another example of a filter diagnostic system.

While the example of FIG. 4 demonstrates the diagnostic filter 408 connected and used for fault detection with respect to a single target filter 402, the diagnostic filter further can be used for any number of one or more such target filters by adding additional switching logics at its inputs. In this regard, FIG. 5 depicts an example of a diagnostic system 500 that, as in the example of FIG. 4, is configured to detect faults or errors associated with operation of a plurality of target filters. In the example of FIG. 5, the target filters 502 and diagnostic filter 504 are demonstrated as low pass filters corresponding to the example filter 100 of FIG. 1. Accordingly reference may be made back to FIG. 1 for additional information about such filter operation. Additionally, in some examples, each of the target filters 502 and diagnostic filter 504 may be configured to add and remove LSBs, corresponding to noise bits. For example, each filter 502, 504 may add (e.g., concatenate) a set of LSBs to the digital input signal X before the gain stage (k) as well as remove the set of LSBs from the filtered signal to provide its digital output Y.

The diagnostic system 500 can include any number of one more target filters 502 and a diagnostic filter 504. As mentioned, the diagnostic filter 504 is configured to perform a filter function that matches the transfer function of a selected one of the target filters to enable fault detection through associated switching logic. For example, the target filter 502 receives an input signal at 502 and the input is also provided to an input of a multiplexer 508. Additional inputs of the multiplexer 508 can correspond to input signals received by any number of other target filters (not shown). Thus, the diagnostic system 500 can be a multichannel diagnostic system to perform corresponding diagnostic functions with respect to filters implemented in each of a plurality of channels. The target filter 502 thus receives the input signal at 506 and provides a corresponding output signal at its output 510. The output at 510 is also connected to an output multiplexer 512 along with outputs of any number of other target filters outputs demonstrated at 514.

In the example of FIG. 5, each of the target filter 502 and diagnostic filter 504 are implemented to be the same circuit implementing the same transfer function. In some examples, each of the target and diagnostic filters 502 and 504 may be instances of the same filter module on a substrate of an IC chip. As a result, the target filter 502 may include diagnostic related components that are not utilized for implementing the target LPF function. Similarly, since the diagnostic filter is not tested for faults, it may include outputs such as for internal data that are not supplied to another filter. In other examples, each of the target filter and diagnostic filter can be designed to include just the components necessary to enable its corresponding operation in the diagnostic system 500.

Since in the example of FIG. 5, the target filter 502 and diagnostic filter 504 are implemented according to the example filter 100 of FIG. 1, each is configured to operate and include bypass to send its input signal to its output during an initialization phase (e.g., corresponding to a single cycle). As demonstrated, the output signal corresponding to internal data from the target LPF 502 is provided at 518 to a corresponding input of an internal data multiplexer 520. If no other target filters were implemented in the diagnostic system 500, the internal data output from target filter 502 could be provided directly to the diagnostic filter 504 (omitting multiplexer 520). However, in this example, the internal data multiplexer 520 can include any number of inputs corresponding to the number of filtered channels in the system 500. The multiplexer 520 receives a channel select input as does each of the multiplexers 508 and 512. Thus the multiplexers 508, 512 and 520 may define a switching network to selectively connect the appropriate signals for a selected channel to corresponding inputs based on the channel select input to implement channel-specific processing by the diagnostic system 500. The channel select input is utilized to select which target filter 502 is being evaluated for fault conditions. The channel select can be provided by associated control circuitry (not shown) to control the fault detection process applied to the different channels. In response to the channel detect switching channels, a change detection circuit 522 selectively activates an internal multiplexer 524 of the diagnostic filter 504. This activates the multiplexer 524 to pass and write the internal data from the selected target filter 502, which is received via multiplexer 520, into corresponding memory of the diagnostic filter 504. After the target filter data has been written (e.g., within in a single clock cycle), the change detection block 522 controls the multiplexer 524 to pass the output 526 of the diagnostic filter 504 into the feedback path and thereby operate the diagnostic filter in a normal operating mode for filtering the input signal received at 506 that is selected via multiplexer 508.

The diagnostic output 526 can be supplied to an input of a comparator 530. Another input of the comparator 530 can receive a selected channel output from the target LPF 502 via multiplexer 512. The comparator 530 thus can compare the output of the diagnostic filter to the selected target output and, based on such comparison, provide the detection signal for use in fault detection by associated circuitry. For example, the comparator 530 output may be written to a register or other memory. After monitoring the target LPF for a prescribed number of samples, the next target filter can be switched in by operating the channel select input to control the multiplexers 508, 512, and 520 to pass the appropriate signals into the diagnostic filter 504 and the digital comparator 530. This process can be implemented during a diagnostic mode such as may be performed at startup or intermittently during operation. By implementing the diagnostic system 500 in this manner, settling time may be mitigated or removed thereby reducing the amount of time needed for diagnostic functions.

Figure 6:
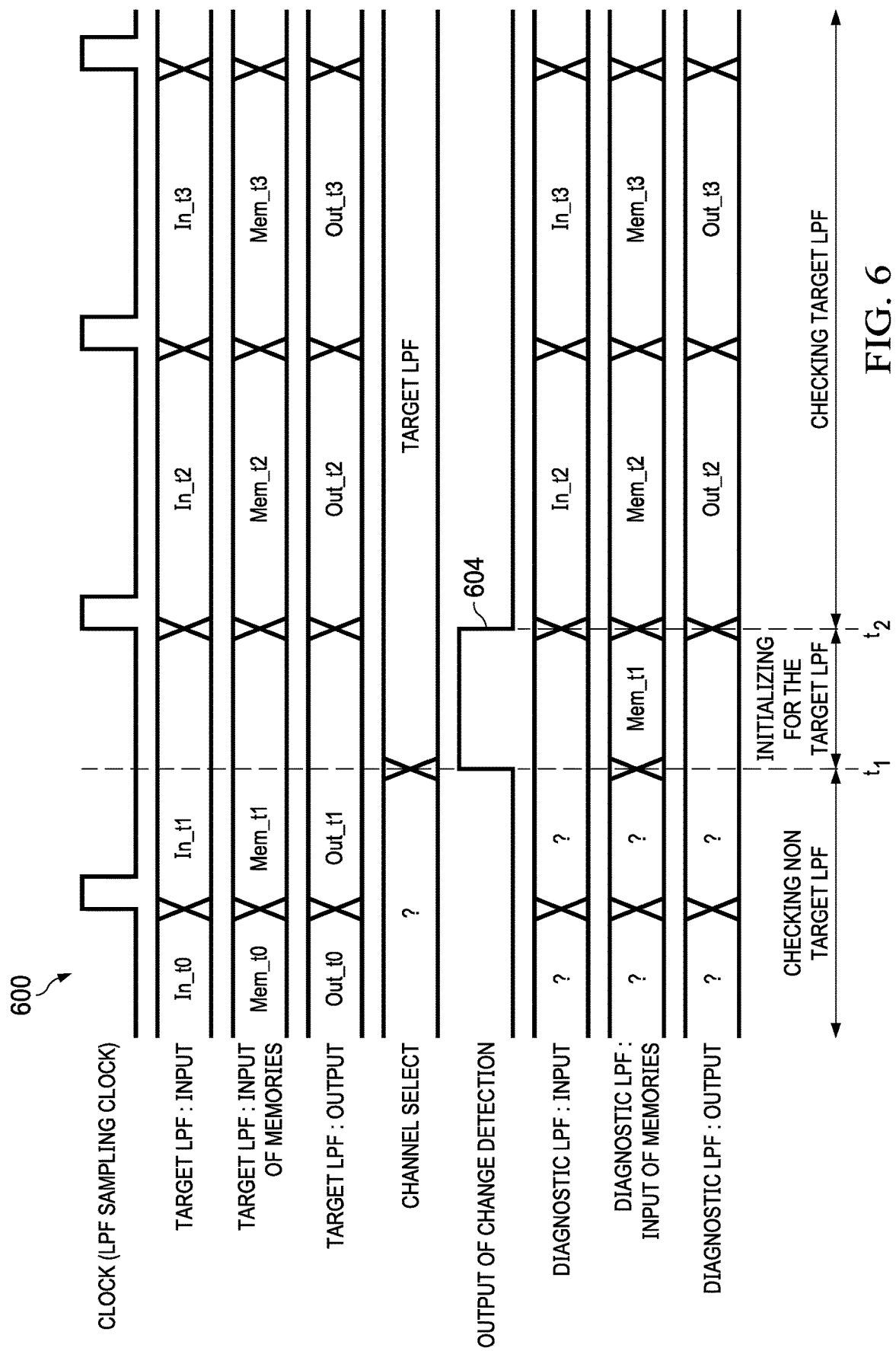
FIG. 6 is a timing diagram showing signals in the system of FIG. 5.

FIG. 6 depicts an example of a timing diagram 600 showing various signals from the system of FIG. 5. For example, the diagram 600 includes a clock signal demonstrating the sample period. In the example of FIG. 6 it is demonstrated that each of the target filters and diagnostic filters operates according to the sample clock period. In FIG. 6, at time $t_1$ the target filter (e.g., filter 502) is initialized for diagnostic functions and the channel select is controlled to connect the target filter output to the diagnostic filter (e.g., via multiplexer 508). At time $t_1$, the change detection block is also activated to provide a corresponding pulse 604, during which the data from filter memory of the selected target filter is written into the memory of the diagnostic filter. In an example, the transfer of the target filter memory can be implemented in response to the change detection pulse 604 in less than the sample clock period. Thus at time $t_2$ the memory of the target filter has been written into the memory of the diagnostic filter such that at the next clock sample period at $t_2$, each of the diagnostic filter and target filters have the same data in memory as well as are configured to receive the same input signal. Thus in the absence of fault condition associated with target one (or diagnostic filter), the input of the memories of the target filter and diagnostic filter and corresponding outputs of the target filter and diagnostic filter should be the same. Thus, following $t_2$, the detector (e.g., comparator 530) can check the target low pass filter by comparing its output to the output of the diagnostic filter.

Figure 7:
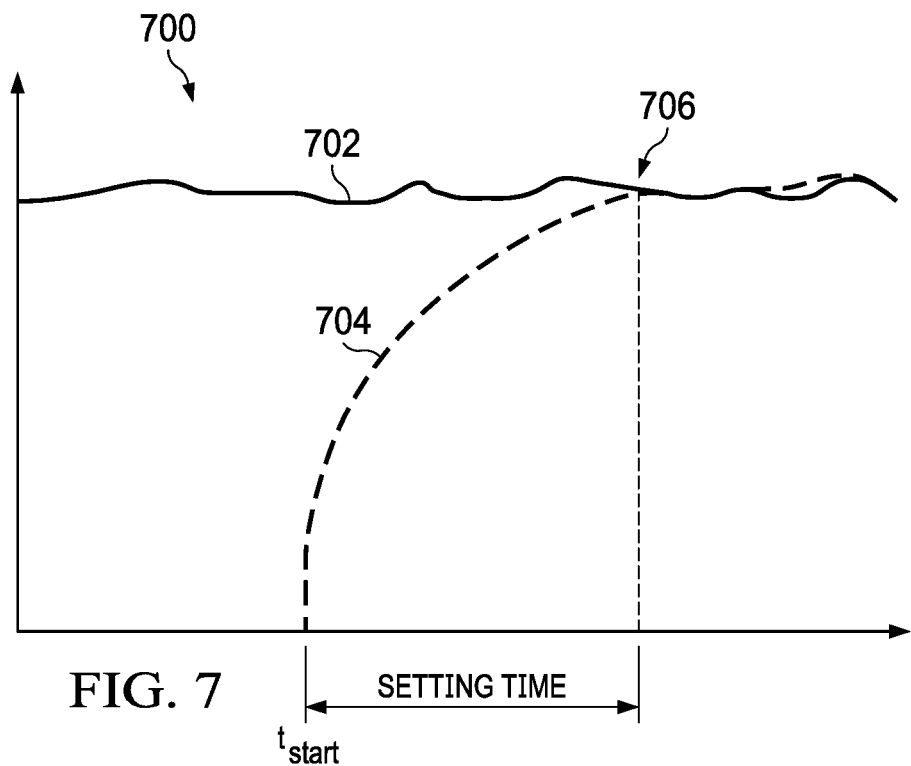
FIG. 7 is a signal diagram showing settling of diagnostic output signals for an existing diagnostic method.

FIG. 7 is a graph 700 that includes a plot of a target filter output signal 702 and an output signal 704 of a diagnostic filter in the absence of the approach herein. For example, at time $t_{start}$, the input of target filter is switched to the diagnostic filter. As shown, substantial settling time will be required until the output of the diagnostic filter matches the output of the target filter demonstrated at 706.

Figure 8:
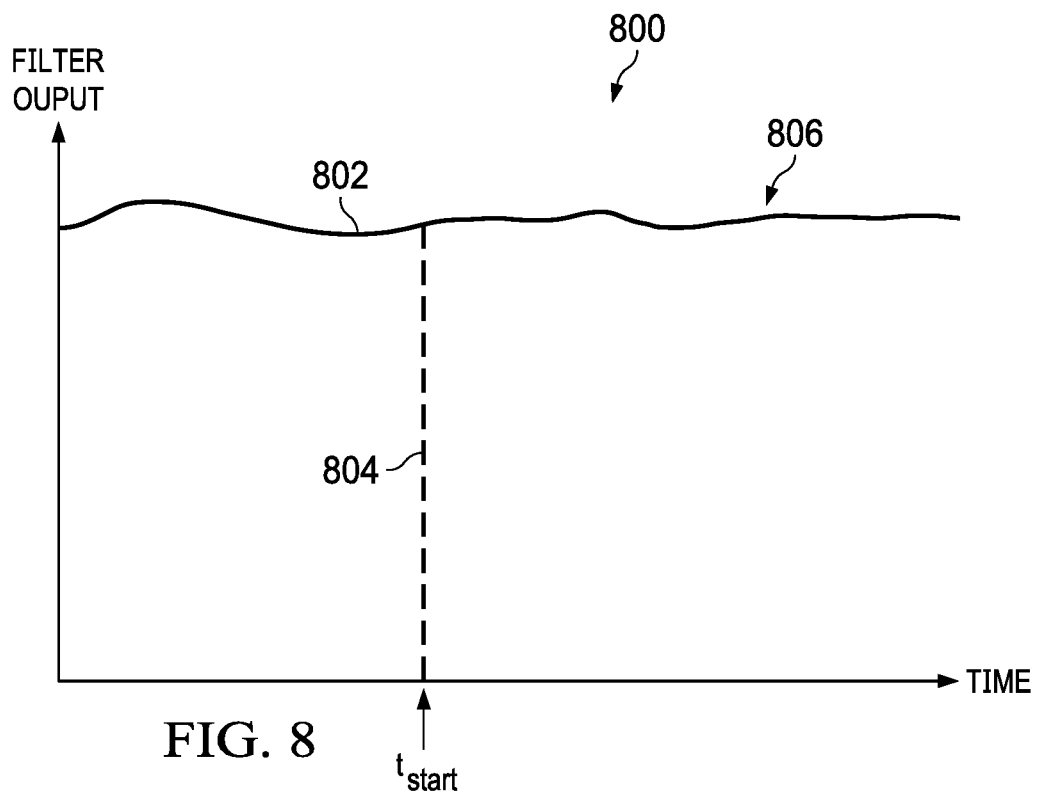
FIG. 8 is a signal diagram showing settling of diagnostic output signals for a diagnostic method according to the approach in FIG. 5.

FIG. 8 is a graph demonstrating enhanced settling using the diagnostic system disclosed herein. Demonstrated in FIG. 8 are the output of a target filter 802 and the output of a diagnostic filter 804. At time $t_{start}$ (e.g., corresponding to time $t_1$ in FIG. 6) the memory of the target filter is written into memory of a diagnostic filter and the inputs are connected to the diagnostic filter such that there is little or zero settling time for the diagnostic filter as demonstrated at the matching output signals at 806 following the start period at $t_{start}$.

Figure 9:
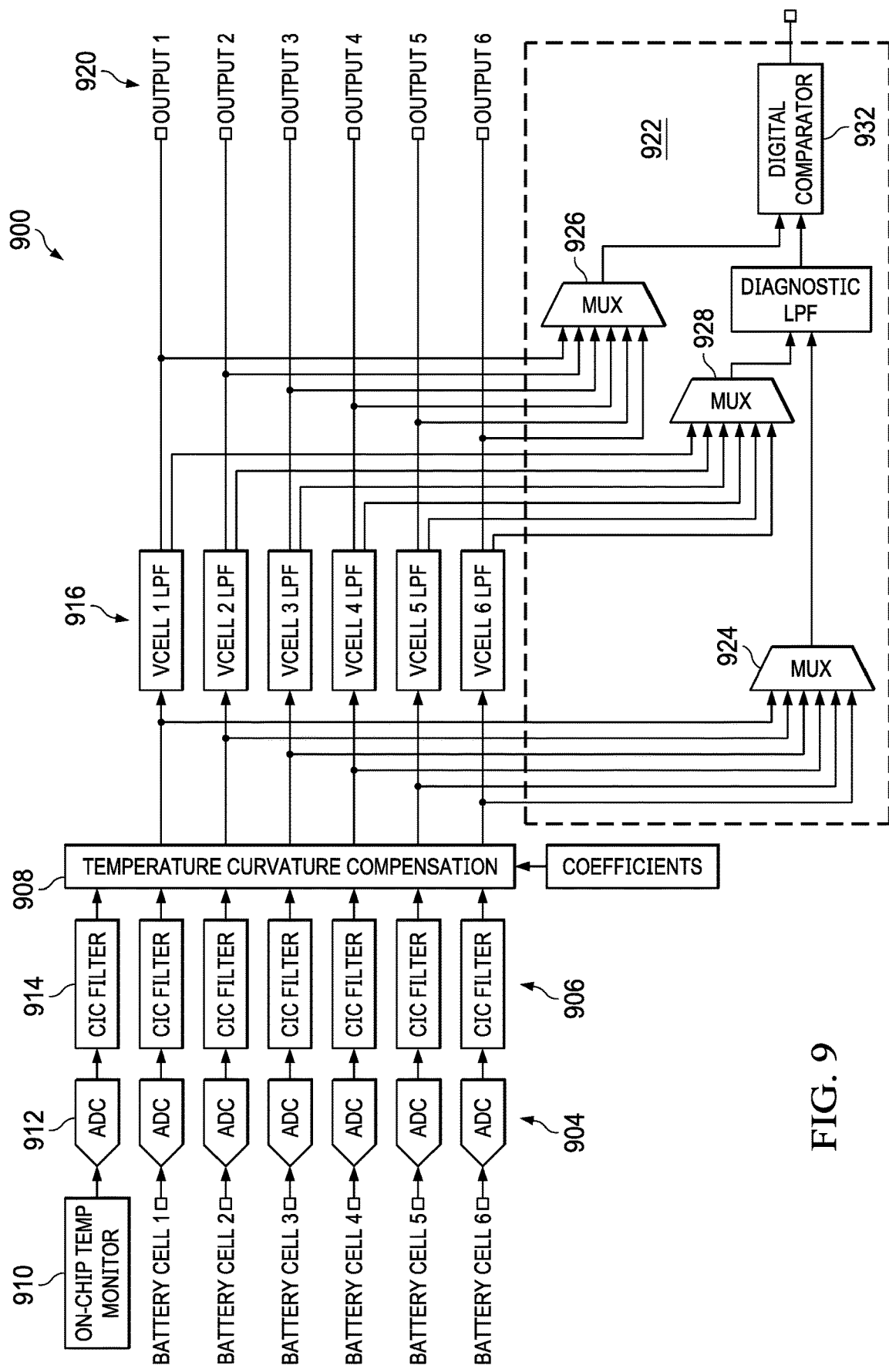
FIG. 9 illustrates an example of a multi-channel filter diagnostic system.

FIG. 9 depicts an example of a multichannel measurement and diagnostic system 900. For example, the measurement and diagnostic system 900 may be utilized to measure the voltage of a plurality of battery cells such as may be in automotive applications that require high accuracy of DC measurements of battery cells (demonstrated as Battery Cell 1 through battery Cell 6) such as may be used in electrical and hybrid vehicles. Each of the battery cells can be connected to via an input of a respective ADC 904. Each ADC 904 is configured to convert the corresponding analog battery voltages into digital output that is provided to a corresponding CIC filter 906. The CIC filter 906 in turn performs low pass filtering and decimation on the digitized values which are provided to a temperature curvature compensation block 908. The compensation block 908 can implement temperature compensation based on a signal from an on-chip temperature monitor 910. For example, the temperature signal from monitor 910 may be processed by an ADC 912 and CIC filter 914, similar to processing of the battery voltages, to provide a corresponding digital temperature value. The compensation block 908 also may receive coefficients applied to compensation data. The temperature compensation block 908 provides corresponding temperature compensation digital filter values to respective low pass filters 916 associated with each of the input channels. Each of the low pass filters 916 can correspond to the filter disclosed with respect to FIG. 1. Other types of filters may be used in other examples. The filtered outputs are in turn provided as multi-bit digital voltage values that can be provided via outputs 920 to corresponding registers for each of the battery cells for subsequent processing and evaluation.

The system 900 also includes a diagnostic subsystem 922 in which each of the inputs and outputs of the respective filters 916 are supplied to inputs of respective multiplexers 924 and 926. Additionally, internal filter data from each of the filters 916 is connected to another multiplexer 928 for providing corresponding internal filter data to a diagnostic filter 930, as disclosed herein. The output of the diagnostic filter 930 and the output multiplexer 926 are connected to the digital comparator 932 for comparing the respective outputs and detecting fault conditions associated with one of the target filters 916 that is being processed. For example, a diagnostic mode may be enabled at designated times (e.g., start-up) and/or intermittently during operation to ensure that each of the filters 916 is operating within expected operating conditions. Control signals are provided to each of the multiplexers and the diagnostic filter to select a given target filter for performing such diagnostics. The output of the digital comparator 932 together with the channel selection signals thus may be stored in memory to indicate whether or not each filter 916 is operating within expected operating parameters.

Figure 10:
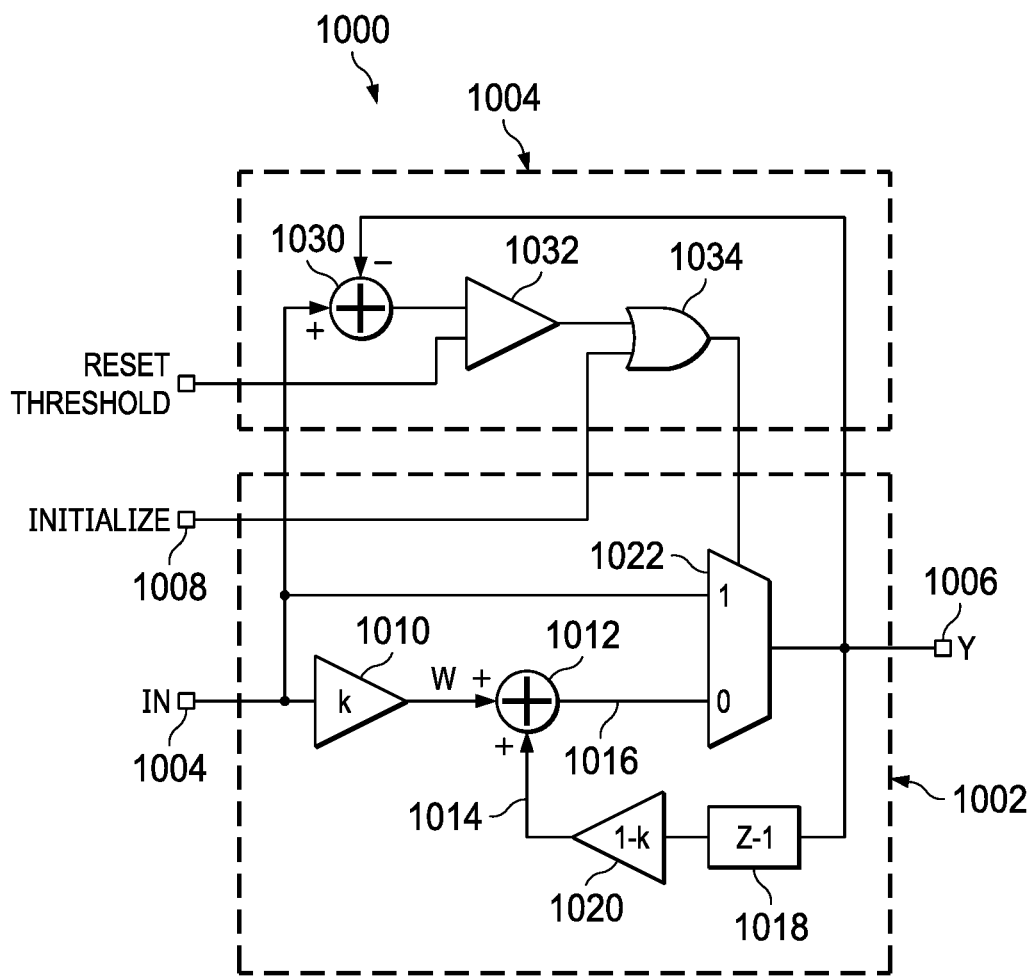
FIG. 10 illustrates another example of filter including reset circuitry.

FIG. 10 illustrates an example of filter system 1000 that includes a filter circuit 1002 reset circuitry 1004. The reset circuitry 1004 facilitates operation of the filter in circumstances where the DC level changes dynamically. The filter 1002 is demonstrated as a digital low pass filter corresponding to the example filter 100 of FIG. 1, and reference may be made back to the description of FIG. 1 for additional information. Thus, the filter 1002 is configured to filter an input signal received at 1004, according to a filter transfer function, to provide a filtered output signal at output 1006.

Briefly stated, the filter 1002 includes a forward path that includes a gain stage 1010 and a combiner 1012. A feedback path connected between the output 1006 and the combiner 1012. In an example, the feedback path includes a delay element 1018 and a gain stage 1020. The delay element 1018 is configured to impose a predetermined delay to the output signal. The gain stage 1020 is configured to apply a gain factor of (1−k) to the delayed output signal and provide the feedback to an input of the combiner 1012. While the example filter 1002 is demonstrated a first order, low pass filter, as disclosed herein, in other examples, different types and orders of filters may be used.

The filter 1002 also includes a bypass device 1022 connected between the filter output 1006 and the output 1016 of the combiner 1012 of the forward path. Another input of the bypass device 1022 is connected to input 1004 to receive the input signal. The bypass device 1022 is configured to send the input signal received at 1004 directly to the output 1006 and to the feedback path for the initialization phase in response to the initialization signal at 1008 (via OR-gate 1034). Thus, the transfer function of the filter 1002 is modified such that the DC part of the input is settled during the initialization phase. By implementing the filter 1002 in this manner, sending the input to the output during the first cycle and resuming normal operation thereafter, the filter can achieve low or zero settling time.

In the example of FIG. 10, reset circuitry 1004 is configured to reset operation of the filter in situations where the DC signal changes dynamically greater than a predetermined amount. The reset circuitry 1004 includes a different block configured to determine a difference between the output at 1006 and the input at 1004, such as by subtracting the output from the input. The difference is provided to a comparator 1032 configured to compare the difference to a reset threshold. In response to detecting that the difference exceeds the reset threshold, the comparator asserts it output, which is provided to an input of OR-gate 1034. The OR-gate also receives at another input the initialize signal at 1008. The OR-gate is coupled to provide a control input the bypass device 1022. In this way, if either the initialize signal is asserted or a reset condition exists (e.g., the differences between input and output exceeds the threshold), the OR-gate 1034 operates the bypass device 1022 to couple the input to the output. After the initialization phase has ended and/or after the difference has reduced to below the threshold, the OR-gate controls the bypass device to couple the output of the filter's forward path 1016 with the output 1006.

What have been described above are examples of the disclosure. It is not possible to describe every conceivable combination of components or method for purposes of describing the disclosure, but many further combinations and permutations of the disclosure are possible. Accordingly, the disclosure is intended to embrace all such alterations, modifications, and variations that fall within the scope of this application, including the appended claims.

Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A filter apparatus comprising:
   an input to receive an electrical input signal;
   a forward path connected between the input and an output of the filter apparatus;
   a feedback path connected to provide feedback to the forward path based on an output signal at the output;
   a multiplexer having a first input connected to the input of the filter apparatus, a second input connected to the forward path, a control input and an output connected to the output of the filter apparatus; and
   wherein the multiplexer is operable to connect the input of the filter apparatus to the output of the filter apparatus for a first cycle of filter operation, corresponding to an activation phase, and connect the forward path to the output of the filter apparatus for subsequent cycles of operation of the filter apparatus.

2. The filter apparatus of claim 1, wherein the forward path comprises:
   a gain stage to apply a gain factor to the input signal to provide an intermediate signal; and
   a combiner configured to add the feedback to the intermediate signal to provide the output signal.

3. The filter apparatus of claim 2, wherein the feedback path comprises:
   a delay element to impose a predetermined delay to the output signal; and
   a gain stage to apply another gain factor to the delayed output signal and provide the feedback to the combiner.

4. The filter apparatus of claim 2, wherein the second input is coupled to an output of the combiner.

5. The filter apparatus of claim 1, wherein the filter apparatus is an infinite impulse response digital filter or a finite impulse response digital filter.

6. A system comprising the filter apparatus of claim 5 and a battery measurement system, the battery measurement system comprising:
   an analog-to-digital converter to convert an input analog battery voltage to a digital value representing the battery voltage;
   digital processing configured to process the digital value and supply the input signal to the input of the digital filter.

7. The system of claim 6, wherein the battery measurement system further comprises:
   a diagnostic filter configured to receive the input signal at an input of the diagnostic filter and to receive internal data from memory of the digital filter; and
   a detector configured to detect a defect in the digital filter based on the output of the digital filter and an output of the diagnostic filter.

8. The system of claim 7, wherein the diagnostic filter includes memory to store filter data, the battery measurement system further comprising:
   a switch device configured to selectively couple one of filtered output data of the diagnostic filter or the internal data from the memory of the digital filter to write the selected data into the memory of the diagnostic filter.

9. The system of claim 8, wherein the diagnostic filter is configured as another instance of the digital filter.

10. A method comprising:
    receiving an input signal as a filter input;
    filtering the input signal according to a filter transfer function to provide a filtered output signal at an output, the filtering being determined based on feedback that is derived based on filtered output signal;
    sending the input signal directly to the output to bypass the filtering of the input signal during an initial activation period; and
    removing the bypass to enable the filtering of the input signal after the initial activation period.

11. The method of claim 10, wherein the filtering further comprises:
    applying a gain factor to the input signal to provide an intermediate signal; and
    combining the feedback with the intermediate signal to provide a combiner output signal, the combiner output signal corresponding to the filtered output signal after the initial activation period.

12. The method of claim 11, wherein the feedback is derived by:
    imposing a predetermined delay on the output signal to provide a delayed output signal; and
    applying another gain factor to the delayed output signal to provide the feedback that is combined with the intermediate signal.

13. The method of claim 11, wherein one of the input signal and the combiner output signal is provided as the filter output signal based on an initialization signal, the initialization signal having one value during the initial activation period and another value after the initial activation period.

14. The method of claim 10, wherein the initial activation period is one sample period.

15. The method of claim 10, further comprising:
    converting an input analog battery voltage to a digital value representing the battery voltage at a sample rate;
    processing the digital value to provide the input signal as the filter input.

16. The method of claim 15, wherein the filtering is implementing by a low pass filter having internal memory to store internal filter data, the method further comprising:
    receiving the input signal at an input of another filter configured as another instance of the low pass filter, the other filter also receiving internal data from memory of the low pass filter;
    filtering, by the other filter, the input signal according to the filter transfer function to provide another filtered output signal at an output of the other filter, the filtering being determined based on internal data from the memory of the low pass filter; and detecting a defect in the low pass filter based on a comparison of the output of the low pass filter and the output of the other filter.

17. The method of claim 16, wherein each of the low pass filter and the other filter are configured to operate according to the same transfer function.

18. The method of claim 16, wherein the low pass filter is a given one of a plurality of low pass filters, the method further comprising:

selecting one of the plurality of low pass filters;

connecting an input signal of the selected the low pass filter to an input of the other filter; and connecting internal memory of the selected the low pass filter to write internal data from the memory of the internal data from the memory of selected the low pass filter into the other filter, wherein the defect is detected based on a comparison of the output of the selected low pass filter and the output of the other filter.

* * * * *